US009349969B2

(12) United States Patent
Kwon et al.

(10) Patent No.: US 9,349,969 B2
(45) Date of Patent: May 24, 2016

(54) ELECTRONIC DEVICES WITH FLEXIBLE DISPLAY AND METHOD FOR MANUFACTURING THE SAME

(71) Applicant: LG Display Co., Ltd., Seoul (KR)

(72) Inventors: Seyeoul Kwon, Goyang-si (KR); Juhn Suk Yoo, Goyang-si (KR); Jae Hun Yang, Gyeongsan-si (KR); Heeseok Yang, Ansan-si (KR); Chanwoo Lee, Paju-si (KR); Sangcheon Youn, Seoul (KR); Soyoung Jo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/168,872

(22) Filed: Jan. 30, 2014

(65) Prior Publication Data

US 2014/0217382 A1 Aug. 7, 2014

Related U.S. Application Data

(60) Provisional application No. 61/760,017, filed on Feb. 1, 2013.

(30) Foreign Application Priority Data

Nov. 29, 2013 (KR) ........................ 10-2013-0147463

(51) Int. Cl.
*H01L 27/32* (2006.01)
*H01L 51/00* (2006.01)
*H01L 51/52* (2006.01)

(52) U.S. Cl.
CPC ........ *H01L 51/0097* (2013.01); *H01L 51/5246* (2013.01); *H01L 27/3241* (2013.01); *Y02E 10/549* (2013.01)

(58) Field of Classification Search
CPC .................................................... H01L 27/326
USPC ........................................................... 257/40
See application file for complete search history.

(56) References Cited

U.S. PATENT DOCUMENTS 8,890,408 B2 11/2014 Maatta
2006/0139271 A1 6/2006 Okuda
2010/0302478 A1 * 12/2010 Nakagawa et al. ............ 349/62
2013/0002572 A1 1/2013 Jin et al.
2013/0088671 A1 * 4/2013 Drzaic et al. .................. 349/106
2014/0152646 A1 * 6/2014 Kang .................. G09G 3/2085 345/214

FOREIGN PATENT DOCUMENTS

JP 2004-258236 A 9/2004
JP 2007-079133 A 3/2007
JP 2010-276808 A 12/2010
KR 10-2010-0040063 A 4/2010

OTHER PUBLICATIONS

PCT International Search Report for PCT/KR2014/000924, May 27, 2014, 3 Pages.

* cited by examiner

*Primary Examiner* — Edward Wojciechowicsz
(74) *Attorney, Agent, or Firm* — Fenwick & West LLP

(57) ABSTRACT

Embodiments of the present disclosure can significantly reduce the non-display area of a flexible OLED display, which would otherwise be covered by a cosmetic trim such as a bezel or an opaque. As such, an electronic device with a display having minimized border area can be provided. This makes it possible to reduce the overall size of the electronic device without sacrificing the size of the display therein. Such a reduction in size of the bezel was achieved by bending the flexible substrate near its edge using an insert member.

20 Claims, 8 Drawing Sheets

BZA
200
P1
220
Start
210
230
270
254
BP
262
244
250
260
harsh curvature
264
240
End
P2
Central Portion ⟵⟶ Edge Portion

ELECTRONIC DEVICES WITH FLEXIBLE DISPLAY AND METHOD FOR MANUFACTURING THE SAME

CROSS-REFERENCE TO RELATED APPLICATIONS

This application claims priority under 35 U.S.C. §119(e) to U.S. Provisional Patent Application No. 61/760,017 filed on Feb. 1, 2013 and under 35 U.S.C. §119 (a) to Korean Patent Application No. 10-2013-0147463 filed on Nov. 29, 2013, the disclosures of which are incorporated herein by reference.

BACKGROUND OF THE INVENTION

1. Technical Field

This relates generally to electronic devices, and more particularly, to displays for electronic devices.

2. Description of the Related Art

Electronic devices often include displays to present information for a user. Such displays are often made from rigid display structures with large non-display area to accommodate circuitry necessary for operating display pixels in a display area of the display. In some displays, the width of the non-display area reaches up to a centimeter wide or more. Such a wide non-display area tends to make displays bulky, which in turn, necessitates use of a cosmetic trim structure such as a bezel or a ring of opaque mask.

It is often desirable to maximize the display area of electronic devices without increasing the overall size of the device itself. As such, attempts are being made to reduce the size of the portion required to be covered by the bezel.

Flexible displays, which can be flexed without losing the functionality, are gaining significant attention as the next generation display technology. Flexible displays offer several advantages over the conventional rigid displays. Features offered by the flexible displays include slimmer form factor, lighter weight, increased durability, and most of all, freedom to design unique electronic devices, which could not be achieved with the rigid displays.

In a typical flexible display, an array of light-emitting diodes such as organic light-emitting diodes may forma planar active display area on a flexible substrate. Even for a flexible display, there is a minimal space requirement on the flexible substrate to accommodate circuitry and/or various other components interacting with display pixels in the display area.

Accordingly, needs exist for a display structure and a method to minimize the portion of a display that needs to be covered by a cosmetic trim structure.

BRIEF SUMMARY

An electronic device may be provided that has a display such as a flexible display. Flexible displays may include organic light-emitting diode (OLED) displays on a display area of a flexible substrate. OLED displays contain display pixels that can produce illumination without using a separate backlight unit. To reduce the size of the display portion that needs to be covered by a bezel, edge portions of the flexible substrate may be bent away from the plane of the display area.

Sometimes, support films for supporting the flexible substrate may be disposed on an inner side of the flexible substrate. However, inventors of the embodiments described herein have recognized that the support films at the inner side of the flexible substrate create several undesired side effects. For instance, larger force needs to be applied to bend both the flexible substrate and the supporting film to a desired curvature. The force required to bend both the flexible substrate and the support film often result in excess mechanical stress to the bent portion of the flexible substrate. Also, the increased mechanical stress may also affect the various components on the bent portion, for example, wires and insulation layer, and generate cracks or fractures.

In addition, the flexible substrate with the support film at the bent edge portion has a tendency to return to its original flat shape. This tendency can cause the bent portion to become separated from a mounting structure to which it is adhered. The tendency to go back to the original state may also exert an undesired force on various components or structures in the electronic device.

Accordingly, an improved flexible display with a novel configuration enabling minimized bezel without the excess stress to the components is provided herein.

An aspect of the present disclosure is related to a flexible display, which facilitates to minimize bezel size in an electronic device employing the flexible display.

In an embodiment, a flexible OLED display includes a flexible substrate. The flexible substrate has a first portion where a plurality of organic light-emitting diode is disposed thereon. The flexible substrate also has a bent portion, which is curved inwardly from the plane of the first portion of the flexible substrate. There is also a second portion of the flexible substrate that extends from the bent portion and is positioned underneath the plane of the first portion of the flexible substrate. A first support film is disposed on an inner surface of the first portion of the flexible substrate. Also, a second support film that is disposed on an inner surface of the second portion of the flexible substrate. The first support film and the second support film are spaced apart from each other so that the bent portion of the flexible substrate is free of a support film. A space would be formed under the flexible substrate at the bet portion. However, an insert member is disposed between the first support film and the second support film such that a rounded end of the insert member extends towards the bent portion of the flexible substrate. Accordingly, undesired strain to the bent portion of the flexible substrate or to the circuitry on the bent portion BP of the flexible substrate from bending of the flexible substrate can be reduced.

In some embodiments, the rounded end of the insert member has a radius of curvature that is substantially equal to that of the bent portion of the flexible substrate.

In some embodiments, the rounded end of the insert member substantially fills a space under the bent portion of the flexible substrate.

In some embodiments, the insert member includes a recessed portion for receiving a chip that is operatively connected to the flexible OLED display. The chip may be operable to recognize touch signal on the flexible OLED display.

An aspect of the present disclosure relates to an electronic device with a minimized bezel.

In an embodiment, the electronic device comprises a flexible substrate having a central portion and an edge portion. A display unit is formed on the central portion of the flexible substrate. Circuitry electrically connected to the display unit is disposed on the edge portion of the flexible substrate. The electronic device further includes an insert member that has a rounded end. The edge portion of the flexible substrate is configured to wrap around at least some part of the rounded end of the insert member.

The insert member may be extended towards the central portion of the flexible substrate and overlap with at least some portion of the display unit formed on the central portion of the flexible substrate.

In some embodiments, the display unit includes a plurality of organic light emitting diodes for displaying an image. The display unit may further includes a plurality of wires configured to recognize a touch input, wherein at least some of the plurality of wires are electrically connected to the circuitry on the edge portion of the flexible substrate.

In some embodiments, the edge portion of the flexible substrate may have curvature that substantially conforms to a curvature of the rounded end of the insert member.

Yet another aspect of the present disclosure relates to a method for manufacturing a flexible OLED display.

The methods includes: disposing an organic light-emitting diode on a top surface of a first portion of a flexible substrate that includes the first portion, a bending portion extended from one side of the first portion, and a second portion extended from one side of the bent portion; disposing a first support film on a bottom surface of the first portion of the flexible substrate and disposing a second support film on a bottom surface of the second portion of the flexible substrate; disposing an insert member on a bottom surface of the first support film; and bending the flexible substrate so as to allow the second portion of the flexible substrate to face at least a part of the first portion of the flexible substrate, wherein a side surface of the insert member adjacent to the bent portion of the flexible substrate is positioned on the substantially same plane as a side surface of the first support film and a side surface of the second support film which are adjacent to the bent portion of the flexible substrate or protrudes toward the bent portion of the flexible substrate.

It should be noted that the embodiments described in the present disclosure are not intended to be bound or otherwise be limited by any express or implied theory presented in the preceding background and brief summary. It should also be appreciated that the following detailed description is merely exemplary in nature and is not intended to limit the embodiments or the application and uses thereof. Hereinafter, exemplary embodiments will be described in detail with reference to the accompanying drawings.

DETAILED DESCRIPTION OF THE PREFERRED EMBODIMENT

Figure 1A:
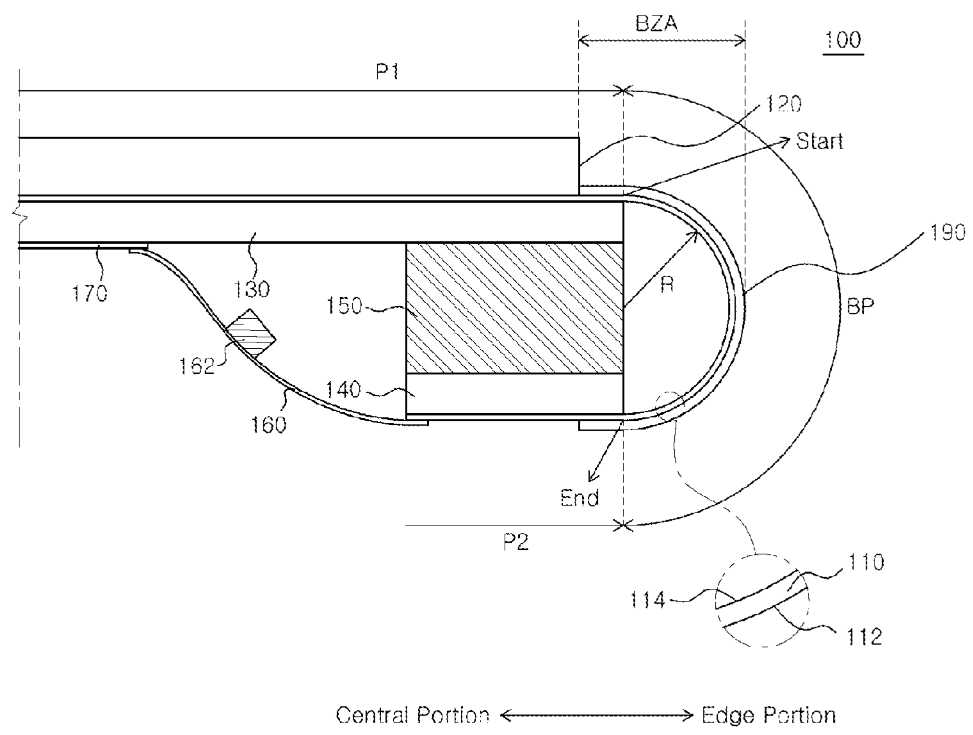
FIG. 1A is a schematic cross-sectional view of a flexible organic light-emitting display for minimizing a bezel area of an electrical device.

Various features and advantages described in the present disclosure will be more clearly understood from the following description with reference to the accompanying drawings. Note that the accompanying drawings are merely illustrative and may not be drawn to scale for easier explanation. Also, components having the same or similar function may be denoted by the corresponding reference symbols/numerals throughout the drawings for describing various embodiments. The corresponding reference numerals, for example, 110, 210, 310 and so on indicate the same elements throughout the specification. The descriptions of the same or similar components may be omitted.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Further, it will be understood that when an element is referred to as being "overlapped" with another element, at least some portion of one element can be positioned above or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or together executed through an association relationship. Hereinafter, various embodiments of the present invention will be described in detail with reference to the accompanying drawings.

Electronic devices may be provided with displays. The displays may include flexible display structures. In the following description, a flexible display refers to a display that can be bent without losing its functionality. For instance, some parts of a flexible display may be bent during manufacturing of a device to form a curved display and/or folded edges. Also, the flexible display may be bent and straightened during actual use of the device that includes such display. Accordingly, a flexible display should be rugged and resilient enough to withstand several types of mechanical stress during manufacturing and usage. As such, the term "flexible display" in the present disclosure encompasses a curved display, a bendable display, a rollable display, a foldable display, a twistable display, a stretchable display and the like.

Figure 1B:
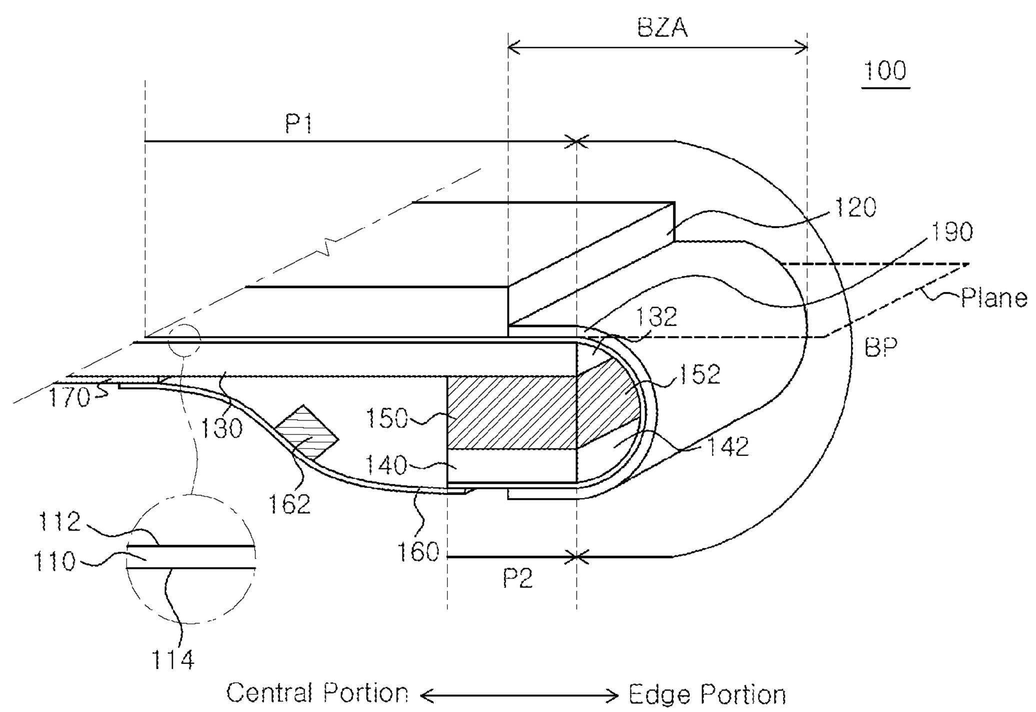
FIG. 1B is a schematic perspective view of the flexible organic light-emitting display shown in FIG. 1A.

FIG. 1A illustrates a schematic cross-sectional view of an exemplary flexible organic light-emitting diode (OLED) display according to an embodiment of the present disclosure. FIG. 1B illustrates a schematic perspective view of the flexible OLED display shown in FIG. 1A.

An illustrative flexible OLED display 100 includes a flexible substrate 110. The flexible substrate 110 can be made of, for example, a polymeric material such as polyimide. Such substrates can be bent within a range of elastic deformation without generating permanent deformation up to a curvature radius of about several mm.

Several elements of the OLED display device 100 may be disposed on the flexible substrate 110. For instance, a display unit 120 is disposed on a central part of the flexible substrate 110, which may be referred to as the display area. The display unit 120 may take up the entire area of the central part or may only take a portion of the central part. Although not shown in the figures, various kinds of circuitry, for example, wires for routing signals to display pixels of the display unit 120 and/or to a touch sensor, may be disposed on the edge of the flexible substrate 110, which may be referred to as the non-display area. For various reasons, these circuitry are generally hidden from the view by covering them with a cosmetic trim, such as bezel or an opaque mask. The portion of the flexible display 100 that may be covered by such cosmetic trims is referred to as the bezel area (BZA).

In order to reduce the size of the bezel area, the edge of the flexible substrate 110 is bent. That is, the edge of flexible substrate 110 is bent downwards (inwards) away from the plane of the display area such that at least some part of the bent edge of the flexible substrate 110 lies underneath the flexible substrate 110 along the plane of the display area.

In this arrangement, the non-display area of the flexible OLED device 100 that needs to be covered by the bezel can be minimized. Any minimal non-display area that remains visible may be covered with a bezel or a portion of a display cover layer that is coated on its underside with an opaque masking layer such as black ink (as examples). A bezel may be formed, for example, from a stand-alone bezel structure that is mounted to a housing of the electronic device or to other suitable structures.

The surface of the flexible substrate 110, on which the display unit 120 is disposed thereon, is defined as the outer surface 112. The surface opposite to the outer surface 112 is defined as the inner surface 114. A support film is provided on the inner surface 114 of the flexible substrate to provide rigidity to some parts of the flexible substrate 110. More specifically, a first support film 130 is disposed on the inner surface 114 of the first portion P1 and a second support film 140 is disposed on the inner surface 114 of the second portion P2.

The insert member 150 is interposed between the first support film 130 and the second support film 140. The insert member 150 fills a space between the first support film 130 and the second support film 140, allows the radius of curvature of the bent portion BP of the flexible substrate 110 to be readily adjusted, and constantly maintains a desired radius of curvature. The insert member 150 may be made of stainless steel (SUS), polyethylene terephthalate (PET), or polycarbonate (PC), but is not limited thereto. The color of the insert member 150 may be selected to match with the color of the housing of the electronic device, in which the flexible OLED display 100 will be employed.

As shown in FIG. 1A, an insulating film 160 is connected to the second portion P2 of the flexible substrate 110 and a circuit board 170. The insulating film 160 can made of a flexible material that can be bent, and circuitry for transmitting signals to the display unit 120 may be formed on the insulating film 160. A chip 162 can be placed on the insulating film 160 as shown in FIG. 1A. The chip 162 and the insulating film 160 are sometimes collectively considered as a package, and referred to as a chip on film (COF). The chip 162 may be a driving device, which can be connected to the circuitry formed on the non-display area of the flexible substrate 110 to supply driving signal to the display unit 120. The circuit board 170 may receive an image signal from another component and supply the signals to the display unit 120 via the circuitry on the insulating film 160 and the non-display area of the flexible substrate 110. The functionality of the chip 162 and the circuit board 170 are not particularly limited, and they may provide various other functionalities, for instance audio, a touch sensing capability on the display area of the flexible OLED display 100, etc. Further, the circuit board 170 may also be made of a flexible material such as a sheet of polyimide or other type of a flexible polymer.

In FIG. 1A, the circuit board 170 is attached to a part of the inner surface of the first support film 130 rather than the insert member 150. The circuit board 170 may be affixed to the flexible substrate 110 to hold the insulating film 160, the second portion P2 of the flexible substrate 110 and the second support film 140 in place without being loosened up. Although FIG. 1A has illustrated that only the circuit board 170C is attached to the part of the bottom surface of the first support film 130, it should be noted that a part of the insulating film 160 may also be attached to another part of the bottom surface of the first support film 130 to which the circuit board 170 is not attached.

As illustrated in FIGS. 1A and 1B, the end of the first support film 130, the end of the second support film 140 and the end of the insert member 150 next to the bent portion BP are arranged to be aligned to each other with an error margin of 150 μm or less. For instance, the alignment between the end of the first support film 130 and the end of the insert member 150 may be off by 150 μm or less. Likewise, the alignment between the end of the second support film 140 and the end of the insert member 150 may be off by 150 μm or less. Accordingly, unlike the first portion P1 and the second portion P2, the bent portion BP of the flexible substrate 110 is not supported by the support film (except for the possible error margin during the manufacturing process).

The bent portion BP of the flexible substrate 110, which is free of support film, enables bending of the flexible substrate 110 with a less amount of force than the case where the support film is disposed on the entire inner surface of the flexible substrate 110. Accordingly, undesired strain to the bent portion BP of the flexible substrate 110 or to the circuitry on the bent portion BP of the flexible substrate 110 from bending of the flexible substrate 110 can be reduced.

An adhesive layer (not shown) may be used to hold the insert member 150 in place between the first support film 130 and the second support film 140. The adhesive layer may include a pressure-sensitive adhesive, liquid adhesive, light-cured adhesive, high bond adhesive, optically clear adhesive, a foam pad (or tape) type adhesive and other suitable adhesive material. The adhesive layer may be formed on the upper surface of the insert member 150 and/or the lower surface of the insert member 150. The adhesive layer may be formed on the lower surface of the insert member 150 that does not overlap with the second support film 140.

A cover layer 190 may be formed on the outer surface of the flexible substrate 110. The cover layer 190 may be formed from a rigid or flexible transparent material such as plastic or glass. The cover layer may be substantially planar or may have a concave or convex shape. The bent portion BP of the flexible substrate 110 may be covered by the cover layer, and may further extended into the second portion P2 of the flexible substrate 110. The cover layer may be attached on the flexible substrate 110 using a suitable adhesive (e.g., optically clear adhesive, optically clear resin, etc.).

Figure 2:
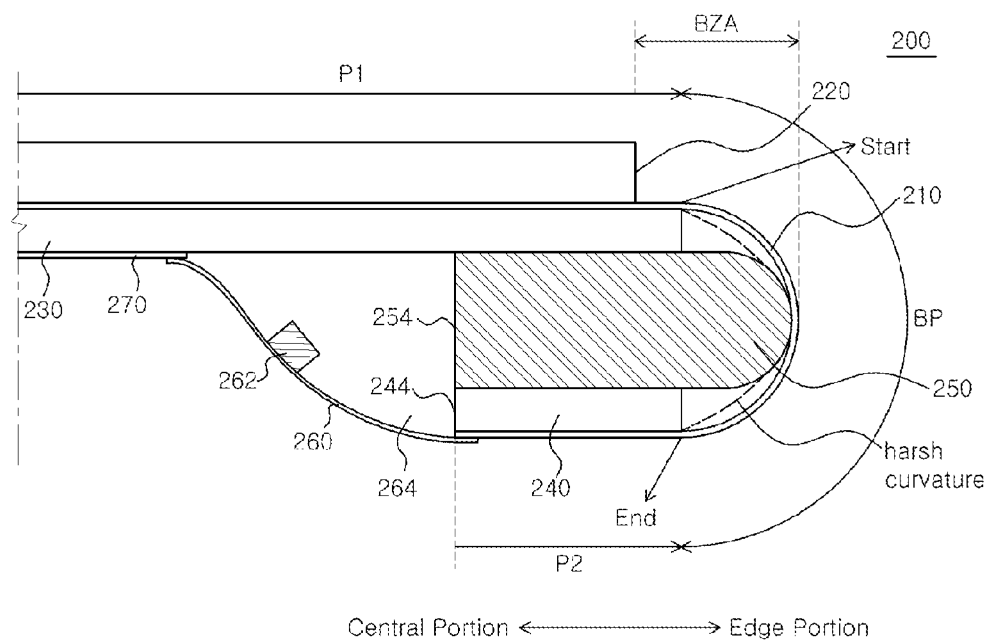
FIG. 2 is a schematic cross-sectional view of a flexible organic light-emitting display with an exemplary insert member with a rounded end according to an embodiment of the present disclosure.

A schematic cross-sectional view of a flexible OLED display having an insert member with a rounded end is shown in FIG. 2. In the embodiment shown in FIG. 2, the end of the insert member 250 is extended out towards the bent portion BP. That is, the end of the insert member 250 is not aligned with the end of the first support film 230 or the end of the second support film 240, but the end of the insert member 250 protrudes out further towards the bent portion of the flexible substrate 210 by more than the error margin (e.g., more than 150 μm).

The end of the insert member 250 may have a rounded shape having a radius of curvature R and may be in contact with the flexible substrate 210 such that at least some part of the bent portion BP wraps around the surface of the rounded end of the insert member 250. The insert member 250 with a rounded end makes it easy to bend the flexible substrate 210 at the bent portion BP as the flexible substrate 210 can be bent along the surface of the rounded end of the insert member 250 with a predetermined radius of curvature. Also, the edges of the flexible OLED display 200 can be maintained to a desired shape according to the shape of rounded end of the insert member 250. Further, the insert member 250 may provide increased protection to the flexible OLED display 200 by preventing the bent portion BP of the flexible substrate 210 to be curved at an excess curvature.

The size of the bezel area BZA may depend on the radius of curvature at the bent portion BP of the flexible substrate 210, which can be controlled by the rounded end of the insert member 250. Accordingly, the radius of curvature R for the rounded end of the insert member 250 may depend on the type of electrical device in which the flexible OLED display 200 will be employed. The radius of curvature R of the rounded end of the insert member 250 may range from 0.1 mm to 10 mm, more preferably range between 0.1 mm and 5 mm, and more preferably range between 0.1 mm and 3 mm. The curvature R can also range from 0.1R to 0.5R. For mobile devices, it might be better to provide a bezel size sufficient to withstand external impact or shock that could be experienced during handling of the device by a user. On the other hand, electrical devices having rather large display (e.g., greater than 18 inches) will likely be stationed as a location, and thus the radius of curvature R can be minimized to the extent possible to reduce the size of the bezel area BZA.

If desired, the bent portion of the flexible substrate 110 may be attached to the end of the insert member 250 by using an adhesive layer, which may include an optically clear adhesive, a pressure-sensitive adhesive, a liquid adhesive, a light-cured adhesive, a high bond adhesive foam pad adhesive or any other suitable adhesive material.

The shape of the insert member 250 in FIG. 2 is merely illustrative, and the insert member 250 can have various other shapes. Especially, the end of the insert member 250 towards the bent portion BP of the flexible substrate 210 may differ from the exemplary insert member 250 of FIG. 2. When the rounded end of the insert member 250 has a smaller radius of curvature than the bent portion BP of the flexible substrate 210, empty space may exist between the insert member 250 and the inner surface of the flexible substrate 210 at the bent portion BP. Some parts of the bent portion BP are not supported by the rounded end of the insert member 250. In this case, the bent portion BP of the flexible substrate 210 may be bent abruptly at the edge of the first support film 230 and/or the edge of the second support film 240. An illustrative bending angle of the flexible substrate 210 is shown as the dashed line denoted as “harsh curvature” in FIG. 2. If the force used in bending the flexible substrate 210 is not controlled carefully, the flexible substrate 210 can be damaged by the edges of the upper support film 230 and the lower support film 250.

Accordingly, in some embodiments, the insert member 250 may have a rounded end that can support a larger area of the bent portion BP. The portion of the insert member 250 that extends beyond the end of the first and second support films (230, 240) may be thicker than the portion of the insert member 250 covered under the first and/or second support films (230, 240). The part of the insert member 250 that protrudes out may substantially fill the space formed under the flexible substrate 210 at the bent portion BP.

With the increased radius of curvature, the rounded end of the insert member 250 may fill substantially the entire inner space at the bent portion BP. This way, substantially the entire bent portion BP of the flexible substrate 210 wraps around the surface of the rounded end of the insert member 250. Since substantially the entire bent portion BP of the flexible substrate 210 is supported by the insert member 250, the mechanical stress to the flexible substrate 210 and the circuitry on the flexible substrate 210 at the bent portion BP can be reduced further. Moreover, the curvature of the flexible substrate 210 at the bent portion BP can be shaped and/or maintained by the rounded end of the insert member 250 without undesired deformation.

In some cases, the upper most edge of the rounded end at the start of the bent portion BP of the flexible substrate 110 may be too sharp and cause undesired damage to the flexible substrate 110 when it wraps around the rounded end of the insert member 150. Accordingly, some portion of the rounded end of the insert member 150 at the starting end of the bent portion BP (e.g., 0.05 mm~0.1 mm along the surface of the rounded end from the “start” of the bent portion BP) may be substantially flat along the plane of the first portion P1 of the flexible substrate 210, with a difference of less than 10 degrees, and more preferably less than 5 degrees. The lower most edge of the rounded end at the opposite end of the bent portion BP of the flexible substrate 210 may be configured in similar fashion to prevent undesired damage to the flexible substrate 210.

While the material used for the insert member 250 is not particularly limited, polymeric materials such as polycarbonate (PC) or polyethylene terephthalate (PET) may be more advantageous for more precise control of the shape in forming the insert member 250.

Figure 3:
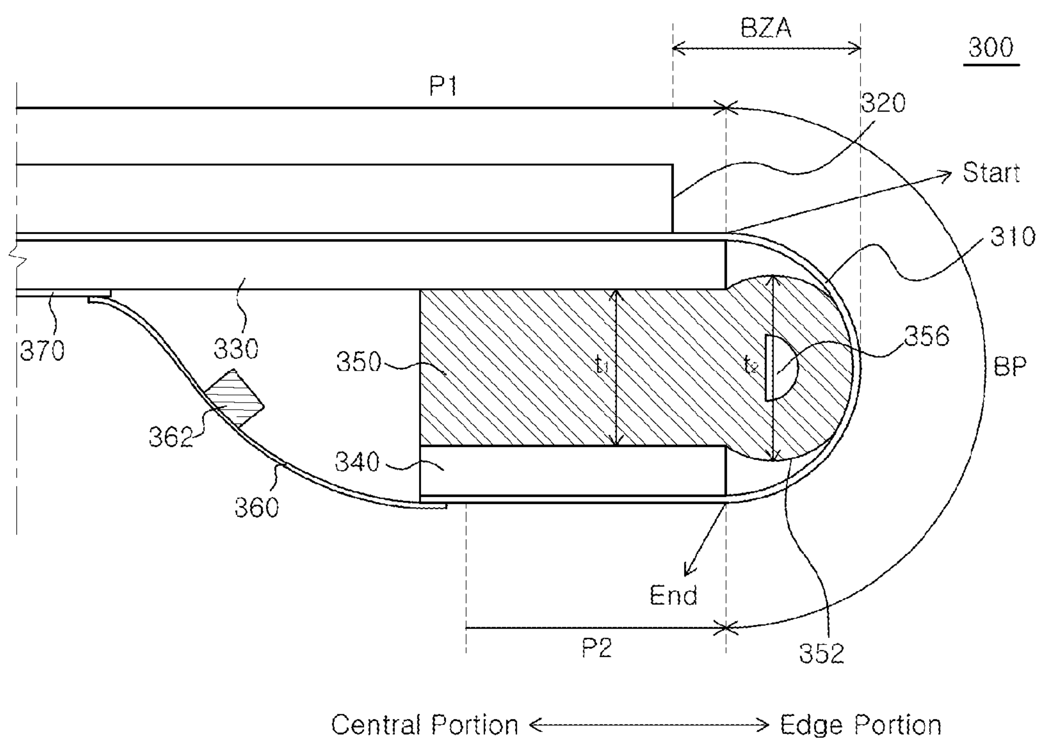
FIG. 3 is a schematic cross-sectional view of a flexible organic light-emitting display with an exemplary insert member with a rounded end according to an embodiment of the present disclosure.

A schematic cross-sectional view of a flexible OLED display having an insert member made with a rounded end is shown in FIG. 3. The insert member 350 may be formed of the stainless steel (SUS). In the embodiment shown in FIG. 3, the insert member 350 includes a first portion having a first thickness t1 and a second portion having a second thickness t2, and the second thickness t2 is greater than the first thickness t1. The first portion of the insert member 350 having the first thickness t1 is the portion being covered by the first support film 330 and/or the second support film 340. The second portion of the insert member 350 refers to the portion of the insert member 350 that is protruded towards the bent portion BP of the flexible substrate 310 beyond the end of the first substrate 330 and the end of the second substrate 340.

At least some part of the second portion of the insert member 350 may be rounded and in contact with at least some part of the bent portion BP of the flexible substrate 310. The surface 352 of the insert member 350, which is in contact with the bent portion BP, may be formed as a part of an ellipse whose major axis is equal to or longer than the second thickness t2. The surface of the insert member 350, which is in contact with the bent portion BP, may be formed as a part of a circle whose diameter is equal to or longer than the second thickness t2.

The increased thickness at the second portion of the insert member 350 provides increased surface area to be in contact with the bent portion BP to support a larger area of the bent portion BP of the flexible substrate 310. Thus, the curvature at the bent portion BP of the flexible substrate 310 can be maintained, such that more effective protection of the circuitry on the bent portion BP can be afforded.

Various methods can be used to form the second portion of the insert member 350 to be thicker than the first portion of the insert member 350. By way of an example, a metal plate may be folded in half and the folded end may be pressed. The pressed portion bulges the folded end of the insert member 350, thereby making the second portion of the insert member 350 with the second thickness t2. The inner space 356 of the bulged portion of the insert member 350 may serve as a cushion for reducing external impact to the flexible OLED display 300. To this end, a material that can maintain the shape at the second portion of the insert member may be positioned in the inner space 356. The inner space 356 of the bulged portion of the insert member 350 may also be used to accommodate various internal components of the flexible OLED display 300 and/or the electrical device employing the flexible OLED display 300.

In an alternative way of forming the second portion of the insert member, the metal plate may be folded in half around a major axis of a shaper (not shown). In this way, the shape and/or size of the second portion may depend on the shape and/or size of the shaper. The shaper may be removed after forming the second portion of the insert member. The inner space 356 of the second portion of the insert member 350 may be used to accommodate various internal components of the flexible OLED display 300 and/or the electrical device employing the flexible OLED display 300 (e.g., antennas, wires, speakers, touch sensors and the like).

The embodiments described above in conjunction with FIGS. 2 and 3 have utilized the insert member to serve as the structure for supporting the bent portion BP of the flexible substrate. However, a separate element other than the insert member can be utilized in supporting the bent portion BP of the flexible substrate.

Figure 4:
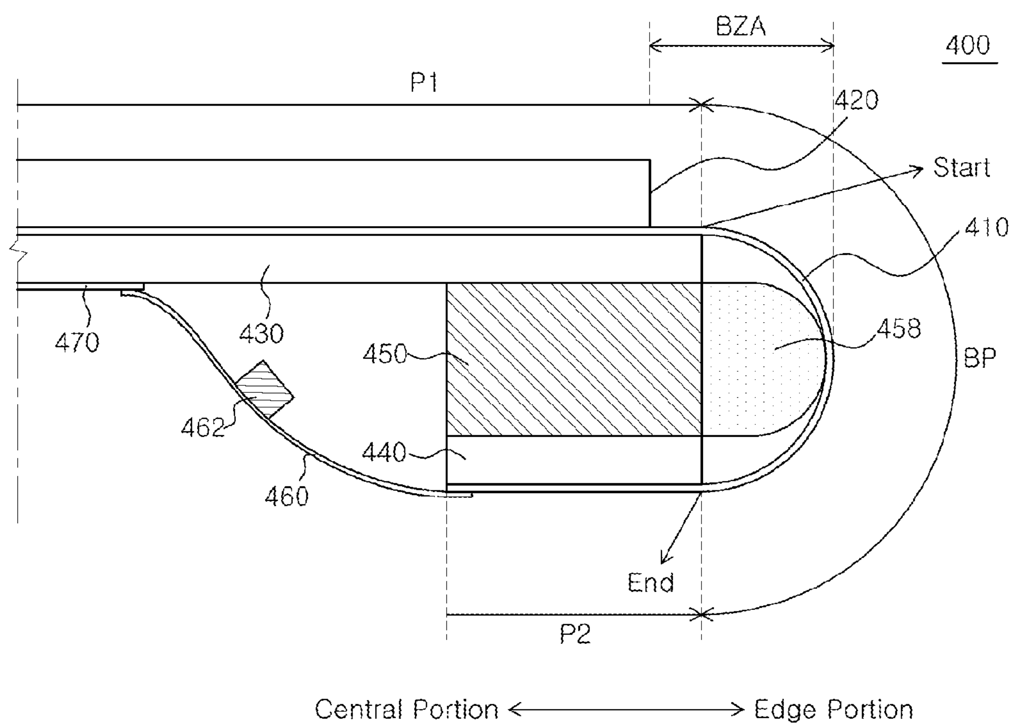
FIG. 4 is a schematic cross-sectional view of a flexible organic light-emitting display with an exemplary shape-retainer according to an embodiment of the present disclosure.

A schematic cross-sectional view of a flexible OLED display with a shape-retainer having a rounded end is shown in FIG. 4. In the embodiment of the flexible OLED display 400 depicted in FIG. 4, the shape-retainer 458, which may be made of a polymeric material such as resin or rubber, is affixed on the side surface of the insert member 450. The shape-retainer 458 is positioned next to the insert member 450, which is substantially aligned with the first (upper) support film 430 and the second (lower) support film 440, such that the rounded end of the shape-retainer 458 extends towards the bent portion BP of the flexible substrate 410.

The shape-retainer 458, with a radius of curvature R, may be in contact with the flexible substrate 110 such that at least some part of the bent portion BP of the flexible substrate 110 wraps around the surface of the rounded end of the shape-retainer 458. The rounded end of the shape-retainer 458 makes it easy to bend the flexible substrate 410 at the bent portion BP as the flexible substrate 410 can be bent along the surface of the rounded end of the shape-retainer 458 with a predetermined radius of curvature. Also, the edges of the flexible OLED display 400 can be maintained to a desired shape according to the shape of rounded end of the shape-retainer 458. Further, the shape-retainer 458 also provides increased protection (e.g., external impact) to the flexible OLED display 400 by supporting the bent portion BP of the flexible substrate 410.

The shape and size of the shape-retainer 458 in FIG. 4 are merely illustrative, and thus the shape-retainer 458 can have various shapes and sizes. When the rounded end of the shape-retainer 458 has a smaller radius of curvature than the bent portion of the flexible substrate 410, empty space may exist between the shape-retainer 458 and the inner surface of the flexible substrate 110 at the bent portion BP. Some parts of the bent portion BP are not supported by the shape-retainer 458. The bent portion BP of the flexible substrate 410 may be bent abruptly at the edge of the upper support film 430 and/or the edge of the lower support film 150 during bending of the flexible substrate 410. An illustrative bending angle of the flexible substrate 410 is shown with a dashed line in FIG. 4. If the force used in bending the flexible substrate 410 is not controlled carefully, the flexible substrate 410 can be damaged by the edges of the upper support film. 430 and the lower support film 450.

Accordingly, in some embodiments, the shape-retainer 458 may have a shape that can support a larger area of the bent portion BP of the flexible substrate 410. The rounded end of the shape-retainer 458 can be thicker than the thickness of the insert member 450, and such that the shape-retainer 458 fills substantially the entire inner space at the bent portion BP. This way, substantially the entire bent portion BP of the flexible substrate 410 is wrapped around the rounded surface of the shape-retainer 458 to be supported by the shape-retainer 458. Accordingly, the mechanical stress to the flexible substrate 410 and the circuitry on the flexible substrate 410 at the bent portion BP can be reduced further. Moreover, the curvature of the flexible substrate 410 at the bent portion BP can be shaped and maintained by the rounded end of the shape-retainer 458 without undesired deformation.

The length of the insert member in the embodiments of the present disclosure may vary for a number of reasons. As mentioned above, the insert member may not be disposed over the entire flexible OLED display as the modulus of the insert member may cause undesired effect to the display unit on the flexible substrate. Accordingly, the insert member may be placed at the edges of the flexible OLED display and extends only partially into the display area of the flexible OLED display. In such a case, the end of the insert member and the end of the second support film towards the central portion of the flexible OLED display may be substantially aligned with each other. They may not be perfectly aligned with each other due to the marginal error during manufacturing of the flexible OLED display. For instance, the displacement between the end of the insert member towards central portion of the flexible OLED display 100 and the end of the second support film towards the central portion of the flexible OLED display may be aligned with each other within margin of 150 μm or less.

Figure 5A:
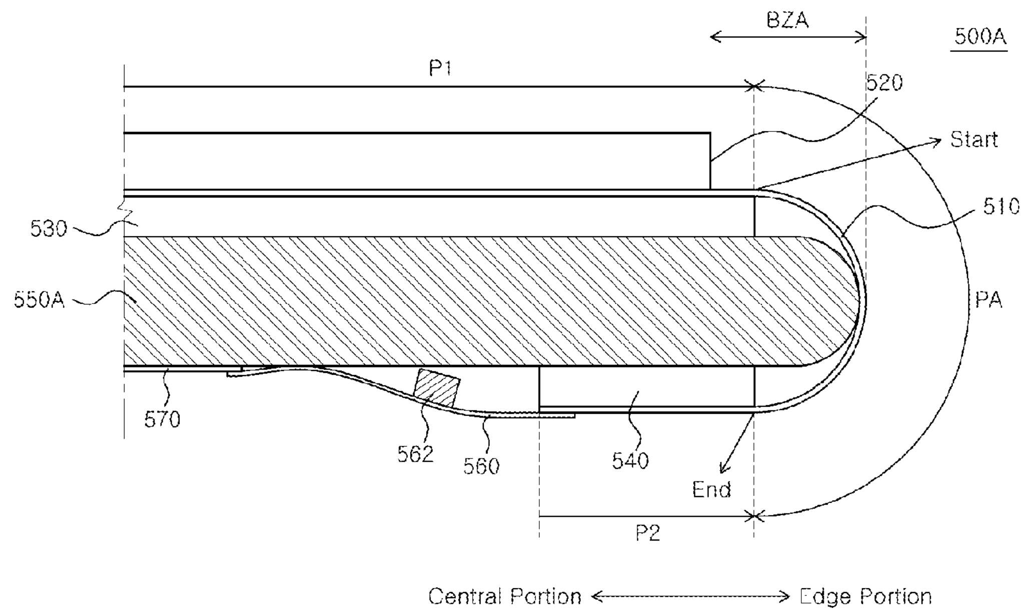
FIG. 5A is a schematic cross-sectional view of a flexible organic light-emitting display with an exemplary insert member according to an embodiment of the present disclosure.

In some embodiments, the insert member may extend further into the central portion of the flexible OLED display 500A as shown in FIG. 5A. That is, the insert member 550A extends towards the central portion of the flexible OLED display 500A over the respective end of the second support film. The longer insert member 550A may overlap with some portion of the display area in the flexible OLED display 500A. For instance, the insert member 550A on one edge of the flexible OLED display 500A may extend from the bent portion BP to the central portion of the flexible OLED display 500A, such that it covers about ¼ of the entire length of the flexible OLED display 500A.

In some embodiments, the circuit board 570 may be placed on the bottom surface of the insert member 550A. One end of the insulating film 560 is affixed on the second portion P2 of the flexible substrate 510 and the other end of the insulating film 560 is affixed on the circuit board 570 to route various signals. In this configuration, the plane level difference between the two ends of the insulating film 560 is reduced, thereby decreasing the chance of the insulating layer 560 being detached at the either ends.

It should be noted that some parts of the insulating film 560 may be attached on the bottom surface of the insert member 550A to further improve the affixation. To this end, it may be desirable to increase the contact area between the insulating film. 560 and the bottom surface of the insert member 550. The surface area of the insulating film 560 that can be attached on the second surface of the insert member 550 may depend on various factors, such as the distance between the two ends that needs to be connected by the insulating film 560, the length of the insulating film 560 as well as the size of the chip 562 mounted on the insulating film 560.

Simply increasing the length of insulating film 560 adds only so much as to increasing the size of the contact area. This is especially true when the distance between the circuit board 570 and the second portion P2 of the flexible substrate 510 is limited. The chip 562 mounted on the insulating film 560 further reduces the contact area.

Figure 5B:
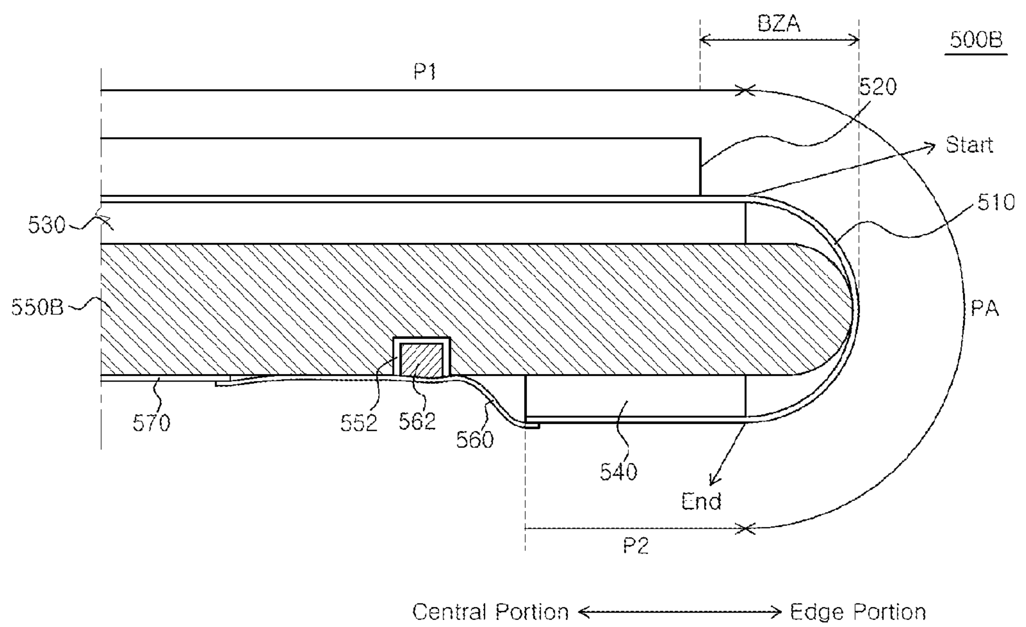
FIG. 5B is a schematic cross-sectional view of a flexible organic light-emitting display with an exemplary insert member having a recessed portion according to an embodiment of the present disclosure.

Accordingly, the insert member 550A may be provided with a recessed portion to receive the chip 562. A schematic cross-sectional view a flexible OLED display having an insert member with a recessed portion is illustrated in FIG. 5B. Referring to FIG. 5B, a recessed portion 552 is formed at the bottom surface of the insert member 550B. The recessed portion 552 of the insert member 550B may be positioned between the circuit board 170 and the second support film 540, and sized sufficiently to accommodate the chip 562 mounted on the insulating layer 560. By inserting the chip 562 in the recessed portion 552, a greater portion of the insulating layer 560 can be in contact with the bottom surface of the insert member 550B. Suitable adhesive layer may be applied to the portion of the insulating layer 560 that is in contact with the bottom surface of the insert member 550B. This provides a more secure way of holding the insulating film 560, the chip 562 mounted on the insulating film 560 and the flexible substrate 510 in place without being loosened up.

In some embodiments, the recessed portion 552 of the insert member 550B and the chip 562 may have interlocking shapes so that the chip 562 can be interlocked within the recessed portion 552 of the insert member 550B. This can improve the affixation of the circuit board 570, the insulating layer 560 and the flexible substrate 510 to each other. An adhesive layer may not be formed between the insulating layer 560 and the bottom surface of the insert member 550B depending on the affixation strength provided by the interlocking mechanism of the chip 562 and the recessed portion 552.

While FIG. 5B illustrates that the chip 562 is positioned within the recessed portion 552, examples of the components that may be placed within the recessed portion 552 include antennas, buttons, switches, speakers or any other components that can fit in the recessed portion 552. Such components may be mounted on an insulating film in the similar fashion as the chip 562 is mounted on the insulating film 560.

Also, such components may be mounted on the circuit board 570 or any other element under the insert member 550. Placing such components in the recessed portion 552 of the insert member 550B can reduce the overall size (e.g., thickness) of the electrical device. Further, in some embodiments, the recessed portion 552 may be configured to receive a securing member (not shown) to accurately position and/or to affix the flexible OLED display 500B within the electronic device.

Moreover, it should be appreciated that the number of recessed portion 552 in the insert member 552 is not particularly limited. Likewise, the sizes of the recessed portions 552 may be different from one another. In some embodiments, the insert member 552 may include more than one recessed portion 552, and each of the recessed portions 552 may be configured to receive different components and/or securing members.

In some embodiments of the flexible OLED display, the insert member may be formed of a material that is difficult to form the recessed portion as described above. For example, forming a recessed portion may be more difficult in an insert member made of a metal sheet (e.g., SUS) than an insert member made of polymeric material (e.g., Polycarbonate). In such cases, a step compensation layer can be used to provide the space for receiving various components of the flexible OLED display and/or internal components of the electrical device employing the flexible OLED display.

Figure 6:
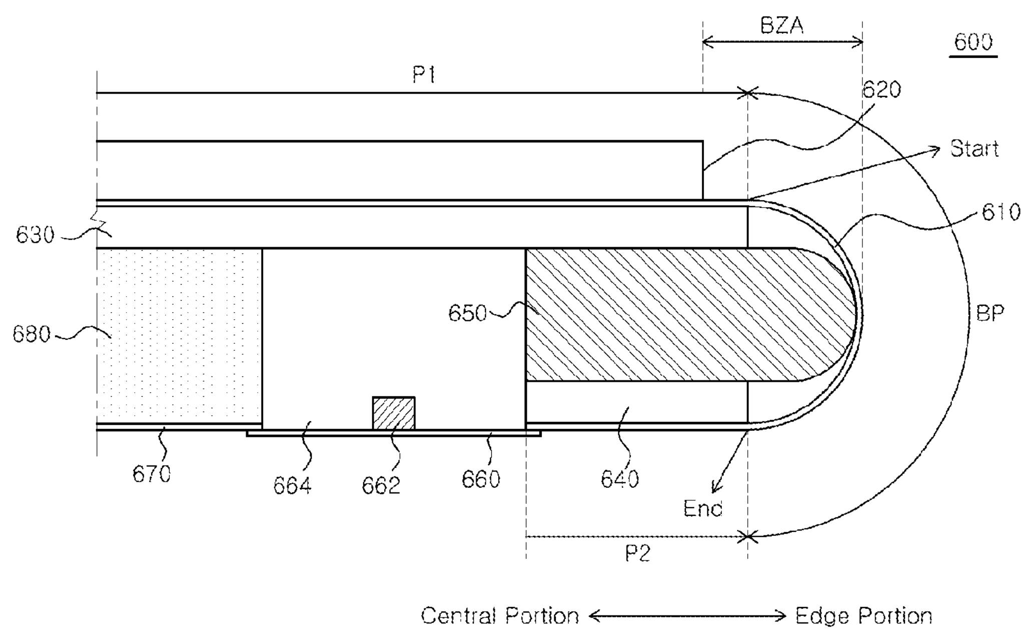
FIG. 6 is a schematic cross-sectional view of a flexible organic light-emitting display with an exemplary step compensation layer according to an embodiment of the present disclosure.

A schematic cross-sectional view of a flexible OLED display 600 having a step compensation layer is shown in FIG. 6. Referring to FIG. 6, a step compensation layer 680 is disposed on a bottom surface of the first support film 630, and the circuit board 670 is affixed on the step compensation layer 680. The step compensation layer 680 may have a thickness that can compensate at least some of the plane level difference between the inner surface of the first support film 630 and the outer surface of the second support film 640.

The step compensation layer 680 is spaced apart from the insert member 650. Similar to the recessed portion 552 of the insert member 550B shown in FIG. 5B, the space 664 between the step compensation layer 680 and the insert member 650 may be used to accommodate various components of the flexible OLED display 600 and/or internal components of the electrical device employing the flexible OLED display 600. As such, the thickness of the step compensation layer 680 and the distance between the step compensation layer 680 and the insert member 650 may vary depending on various factors, including but not limited to, the size of the chip 662 on the insulating film 660 or other components to be inserted into the space 664. Also, it should be appreciated that multiple step compensation layer 680 can be used in the flexible OLED display 600 to provide multiple spaces 664, and each of the spaces 664 may be configured to receive different components and/or securing members.

Unlike the recessed portion 552 of the insert member 550B shown in FIG. 5B, the spaces 664 are created by the spacing between the step compensation layers 680 and the insert member 650. As such, materials for forming the step compensation layer 680 are not particularly limited. For example, the step compensation layer 680 can be made of a material such as stainless steel (SUS), polyethylene terephthalate (PET), polycarbonate (PC) or rubber.

Figure 7:
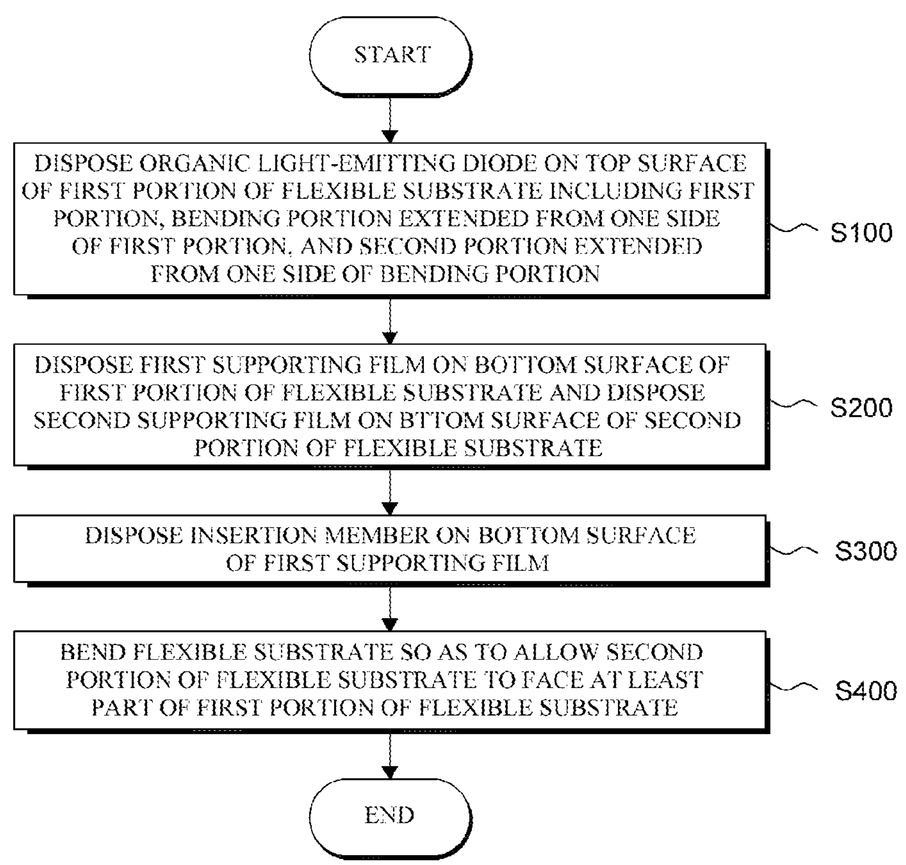
FIG. 7 is a flowchart illustrating an exemplary method for manufacturing a flexible organic light-emitting display according to an embodiment of the present disclosure.

FIG. 7 is a flowchart for describing a method for manufacturing an exemplary flexible OLED display according to an embodiment of the present disclosure.

First, an organic light-emitting diode is disposed on a top surface of a first portion of a flexible substrate (S100). The flexible substrate may be made of a material capable of being bent, that is, a material selected from a group consisting of polyester polymers, silicon polymers, acrylic polymers, polyolefin polymers, and a combination thereof. Specifically, the flexible substrate may be made of a material selected from a ground consisting of polyethylene terephthalate (PET), poly butylene terephthalate (PBT), polysilane, polysiloxane, polysilazane, polycarbosilane, polyacrylate, polymethacrylate, polymethylacrylate, polymethylmetacrylate, polyethylacrylate, polyethylmetacrylate, cyclic olefin copolymer (COC), cyclic olefin polymer (COP), polyethylene (PE), polypropylene (PP), polyimide (PI), polymethylmethacylate (PMMA), polystyrene (PS), polyacetal (POM), polyether ether keton (PEEK), polyestersulfone (PES), polytetrafluoroethylene (PTFE), polyvinyl chloride (PVC), polycarbonate (PC), polyvilyidenefluoride (PVDF), perfluoroalkyl polymer (PVA), styrene acrylonitrile copolymer (SAN), and a combination thereof. However, the material of the flexible substrate is not limited to the aforementioned materials.

An insulating film having a chip mounted thereon may be connected to a circuit board and the second portion of the flexible substrate.

Subsequently, a first and second support film is disposed on an inner surface of the flexible substrate such that the first support film is spaced apart from the second support film (S200). The distance between the first and second support films is substantially equal to the radius of curvature desired at the edge of the flexible OLED display.

The first support film and the second support film may be made of the substantially the same material as that of the flexible substrate. In such a case, the thicknesses of the first and second support films may be relatively thicker than that of the flexible substrate. The first support film and the second support film may be simultaneously disposed, or may be sequentially disposed.

Thereafter, an insert member is disposed on a lower surface of the first support film (S300). The insert member may be made of stainless steel (SUS), polyethylene-terephthalate (PET), or polycarbonate (PC), but is not limited thereto. The insert member may have a rounded end that is extended beyond the aligned ends of the first and second support films. The rounded end of the insert member may have greater thickness than the part of the insert member interposed between the first and the second support films.

Subsequently, the flexible substrate is bent inwards towards the back surface of the panel (i.e., bent at an angle of approximately 180 degrees) (S400). The flexible substrate can be bent along the surface of the rounded end of the insert member. When the flexible substrate is bent, apart of the first portion and the second portion of the flexible substrate are positioned to face each other, and a rounded bent portion is formed between the first portion and the second portion of the flexible substrate. The second support film disposed at the second portion of the flexible substrate is disposed on the bottom surface of the insert member. When the second support film is disposed on a part of the bottom surface of the insert member, the insulating film may be attached to another part of the bottom surface of the insert member.

A step compensation layer may be additionally disposed on the bottom surface of the first support film so as to be spaced apart from the insert member. When the step compensation layer is disposed on the bottom surface of the first support film, at least one of the insulating film and the circuit board may be attached to the step compensation layer, and the chip may be inserted into a space between the insert member and the step compensation layer.

In addition, when the second support film is disposed on apart of the bottom surface of the insert member, a recessed portion may be formed at the bottom surface of the insert member prior to bending the flexible substrate. When bending the flexible substrate, the chip may be inserted into the recessed portion formed at the bottom surface of the support film. The insulating film may be affixed on the bottom surface of the insert member using an adhesive layer.

Hereinafter, various characteristics of the flexible OLED display of the present invention will be described.

In an aspect, an embodiment of the present invention is characterized in that an insert member has a rounded end, and the rounded end has a radius of curvature that is substantially equal to that of a bent edge portion of the flexible display.

In another aspect, an embodiment of the present invention is characterized in that a rounded end of an insert member substantially fills a space at the bent edge portion of a flexible display.

In another aspect, an embodiment of the present invention is characterized in that an insert member is formed of a polymeric material.

In another aspect, an embodiment of the present invention is characterized in that an insert member includes a recessed portion configured to receive a component that is electrically connected to a flexible OLED display.

In another aspect, an embodiment of the present invention is characterized in that a component in a recessed portion of an insert member is operable to recognize a touch signal on a flexible OLED display.

In another aspect, an embodiment of the present invention is characterized in that an insert member includes a recessed portion for receiving a securing member for affixing the flexible OLED display.

In another aspect, an embodiment of the present invention is characterized in that an adhesive layer is on at least some part of an insert member of a flexible OLED display.

In another aspect, an embodiment of the present invention is characterized in that an adhesive layer interposed between an upper support film and an insert member is a foam pad type adhesive.

In another aspect, an embodiment of the present invention is characterized in that a step compensation layer is disposed on a bottom surface of the upper support film so as to be spaced apart from an insert member at the edge portion of a flexible OLED display, wherein at least one of an insulating film and a circuit board is attached to the step compensation layer.

In another aspect, an embodiment of the present invention is characterized in that a chip mounted on an insulating layer is positioned in a space between an insert member and a step compensation layer.

In another aspect, an embodiment of the present invention is characterized in that an insert member is formed of a metal sheet having a first portion with a first thickness and a second portion with a second thickness that is greater than the first thickness, and wherein the second portion of the insert member includes a channel.

In another aspect, an embodiment of the present invention is characterized in that a cover layer is formed on at least parts of an outer surface of the first portion of a flexible substrate, an outer surface of a bent portion of the flexible substrate, and an outer surface of a second portion of the flexible substrate in a flexible OLED display.

Hereinafter, various characteristics of the electronic device of the present invention will be described.

In another aspect, an embodiment of the present invention is characterized in that a display unit on a central portion of a flexible substrate includes a plurality of organic light emitting diodes for displaying an image.

In another aspect, an embodiment of the present invention is characterized in that an edge portion of the flexible substrate has a curvature that substantially conforms to a curvature of the rounded end of an insert member.

In another aspect, an embodiment of the present invention is characterized in that a display unit includes a plurality of wires configured to recognize a touch input, wherein at least some of the plurality of wires are electrically connected to the circuitry on the edge portion of the flexible substrate.

In another aspect, an embodiment of the present invention is characterized in that at least some portion of an insert member overlaps with a display unit formed on a central portion of a flexible substrate.

Hereinafter, various characteristics of the method for manufacturing a flexible OLED display of the present invention will be described.

In another aspect, an embodiment of the present invention is characterized in that the method for manufacturing a flexible OLED display comprises a step for connecting a second portion of the flexible substrate and an insulating film with a chip mounted thereon and connecting a circuit board to the insulating film, wherein the second support film is disposed on a part of a bottom surface of the insert member, and the bending of the flexible substrate includes attaching the insulating film to another part of the bottom surface of the insert member While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A flexible OLED (organic light-emitting diode) display, comprising:

a flexible substrate that includes a first portion, a second portion underneath a plane of the first portion and a bent portion between the first portion and the second portion;

a display unit on an outer surface of the first portion of the flexible substrate, the display unit comprising a plurality of OLED pixels;

a first support film that is disposed on an inner surface of the first portion of the flexible substrate;

a second support film that is disposed on an inner surface of the second portion of the flexible substrate, the inner surface of the second portion of the flexible substrate facing the inner surface of the first portion of the flexible substrate; and an insert member separate from the flexible substrate and disposed between the first support film and the second support film, the insert member having a first surface and a second surface at an opposite side of the first surface, the first surface facing the first support film and the second surface facing the second support film, wherein the insert member has a rounded end that comes into contact with at least a portion of the bent portion of the flexible substrate to support the bent portion.

2. The flexible OLED display according to claim 1, wherein the rounded end of the insert member has a radius of curvature that is substantially equal to that of the bent portion of the flexible substrate.

3. The flexible OLED display according to claim 1, wherein the rounded end of the insert member substantially fills a space under the bent portion of the flexible substrate.

4. The flexible OLED display according to claim 1, wherein the insert member is formed of a stainless steel, polyethylene-terephthalate (PET), and polycarbonate (PC), and wherein the flexible substrate is formed of a material selected from a group consisting of polyethylene terephthalate (PET), poly butylene terephthalate (PBT), polysilane, polysiloxane, polysilazane, polycarbosilane, polyacrylate, polymethacrylate, polymethylacrylate, polymethylmetacrylate, polyethylacrylate, polyethylmetacrylate, cyclic olefin copolymer (COC), cyclic olefin polymer (COP), polyethylene (PE), polypropylene (PP), polyimide (PI), polymethylmethacylate (PMMA), polystyrene (PS), polyacetal (POM), polyether ether keton (PEEK), polyestersulfone (PES), polytetrafluoroethylene (PTFE), polyvinyl chloride (PVC), polycarbonate (PC), polyvilyidenefluoride (PVDF), perfluoroalkyl polymer (PVA), and styrene acrylonitrile copolymer (SAN), and a combination thereof.

5. The flexible OLED display according to claim 1, further comprising:

an insulating film with a chip connected to the second portion of the flexible substrate, wherein the chip is a display driver-integrated circuit or touch-integrated circuit.

6. The flexible OLED display according to claim 5, wherein the insert member includes a recessed portion for receiving the chip.

7. The flexible OLED display according to claim 1, wherein the insert member includes a recessed portion for receiving a securing member for affixing the flexible OLED display.

8. The flexible OLED display according to claim 1, further comprising:

an adhesive layer that is interposed between the first support film and the insert member, wherein the adhesive layer is a foam pad type adhesive layer.

9. The flexible OLED display according to claim 5, further comprising:

a step compensation layer that is disposed on a bottom surface of the first support film so as to be spaced apart from the insert member, wherein at least some part of the insulating film is attached to the step compensation layer, and the chip is positioned in a space between the insert member and the step compensation layer.

10. The flexible OLED display according to claim 1, wherein the insert member is formed of a metal sheet having a first portion with a first thickness and a second portion with a second thickness, the second thickness being greater than the first thickness, and wherein the rounded end of the insert member is formed with a hollow cavity.

11. The flexible OLED display according to claim 1, further comprising:

a cover layer that is formed on at least parts of an outer surface of the first portion of the flexible substrate, an outer surface of the bent portion of the flexible substrate, and an outer surface of the second portion of the flexible substrate.

12. An organic light-emitting diode (OLED) display device, comprising:

a flexible substrate having a central portion mounted with a display unit and an edge portion having a bent portion that is bent downwards away from a plane of the central portion of the flexible substrate, the display unit comprising a plurality of OLED pixels;

an insert member having a first flat surface, a second flat surface at an opposite side of the first flat surface and a rounded end, the rounded end coming into contact with at least a part of the bent portion of the flexible substrate to support the bent portion of the flexible substrate, wherein the bent portion of the flexible substrate has a curvature that substantially conforms to a curvature of the rounded end of the insert member, so that the bent portion of the flexible substrate wraps the rounded end of the insert member;

a first support film between the first flat surface and the flexible substrate; and a second support film between the second flat surface and the flexible substrate.

13. The OLED display device of claim 12, wherein the rounded end of the inset member has a radius of curvature that is equal to that of the bent portion of the flexible substrate or smaller than that of the bent portion of the flexible substrate.

14. The OLED display device of claim 12, wherein the display unit is configured to recognize a touch input.

15. The OLED display device of claim 12, wherein the insert member extends across and beyond an edge of the display unit parallel to a plane along which the display unit extends, the display unit formed on the central portion of the flexible substrate.

16. An organic light-emitting diode (OLED) display device, comprising:

a substrate having a display unit on an outer surface, the display unit comprising a plurality of OLED pixels;

two supporting films on an inner surface of the substrate arranged to face each other, wherein at least a portion of the substrate being-free of the two supporting films is bent backwards at an edge of the OLED display device; and an insert member separate from the substrate, an end of the insert member coming into contact with the portion of the substrate free of the two supporting member but the insert member spaced apart from portions of the substrate attached with the two supporting films by the two supporting films.

17. The OLED display device of claim 16, wherein an end of the insert member toward the edge of the OLED display device is aligned with an end of one of the two supporting films.

18. The OLED display device of claim 16, wherein an end of the insert member is rounded and the rounded end of the insert member protrudes out toward the edge of the OLED display device more than an end of each of the two supporting films.

19. The OLED display device of claim 16, wherein the substrate is formed of a material selected from a group consisting of polyethylene terephthalate (PET), poly butylene terephthalate (PBT), polysilane, polysiloxane, polysilazane, polycarbosilane, polyacrylate, polymethacrylate, polymethylacrylate, polymethylmetacrylate, polyethylacrylate, polyethylmetacrylate, cyclic olefin copolymer (COC), cyclic olefin polymer (COP), polyethylene (PE), polypropylene (PP), polyimide (PI), polymethylmethacylate (PMMA), polystyrene (PS), polyacetal (POM), polyether ether keton (PEEK), polyestersulfone (PES), polytetrafluoroethylene (PTFE), polyvinyl chloride (PVC), polycarbonate (PC), polyvilyidenefluoride (PVDF), perfluoroalkyl polymer (PVA), and styrene acrylonitrile copolymer (SAN), and a combination thereof.

20. The OLED display device of claim 12, wherein the flexible substrate is formed of a material selected from a group consisting of polyethylene terephthalate (PET), poly butylene terephthalate (PBT), polysilane, polysiloxane, polysilazane, polycarbosilane, polyacrylate, polymethacrylate, polymethylacrylate, polymethylmetacrylate, polyethylacrylate, polyethylmetacrylate, cyclic olefin copolymer (COC), cyclic olefin polymer (COP), polyethylene (PE), polypropylene (PP), polyimide (PI), polymethylmethacylate (PMMA), polystyrene (PS), polyacetal (POM), polyether ether keton (PEEK), polyestersulfone (PES), polytetrafluoroethylene (PTFE), polyvinyl chloride (PVC), polycarbonate (PC), polyvilyidenefluoride (PVDF), perfluoroalkyl polymer (PVA), and styrene acrylonitrile copolymer (SAN), and a combination thereof.

* * * * *